United States Patent
Brokaw et al.

(10) Patent No.: US 7,342,463 B2
(45) Date of Patent: Mar. 11, 2008

(54) TIMER CIRCUITS AND METHOD

(75) Inventors: A. Paul Brokaw, Tucson, AZ (US); Yuxin Li, Santa Clara, CA (US)

(73) Assignee: Analog Devices, Inc., Norwood, MA (US)

( * ) Notice: Subject to any disclaimer, the term of this patent is extended or adjusted under 35 U.S.C. 154(b) by 71 days.

(21) Appl. No.: 11/280,516

(22) Filed: Nov. 15, 2005

(65) Prior Publication Data

US 2007/0109062 A1    May 17, 2007

(51) Int. Cl.
  *H03K 3/26* (2006.01)
(52) U.S. Cl. .................. 331/111; 331/143; 327/182
(58) Field of Classification Search .............. 331/111, 331/143; 327/182
See application file for complete search history.

(56) References Cited

U.S. PATENT DOCUMENTS

| | | | | |
|---|---|---|---|---|
| 5,070,311 A | | 12/1991 | Nicolai | 331/111 |
| 5,592,128 A | * | 1/1997 | Hwang | 331/61 |
| 5,668,508 A | * | 9/1997 | Pulvirenti et al. | 331/111 |
| 6,326,859 B1 | | 12/2001 | Goldman et al. | 331/143 |
| 6,924,709 B2 | * | 8/2005 | Bashar | 331/143 |

FOREIGN PATENT DOCUMENTS

WO    WO 2004055968 A2    7/2004

OTHER PUBLICATIONS

Analog Devices 1.2 MHz DC-DC Step-Up Switching Converter, ADP1610, Oct. 2004, pp. 1, 4-16.

* cited by examiner

*Primary Examiner*—Benny Lee
*Assistant Examiner*—Levi Gannon
(74) *Attorney, Agent, or Firm*—Koppel, Patrick, Heybl & Dawson (57) ABSTRACT

A timing circuit operates by applying an arbitrary voltage across a resistance, and using the resulting current to generate a charging current which charges and/or discharges a capacitance to an endpoint voltage. Additional circuitry is arranged such that the capacitance is charged and/or discharged until its voltage crosses a threshold which is proportional to one of the resistance's endpoint voltages, such that the capacitance's endpoint voltage tracks the resistance's endpoint voltage. Thus, the resistor voltage can vary with supply voltage or temperature, or the resistance value itself can vary, without materially affecting the timing relationships. The arbitrary voltage is preferably provided with a pair of diode-connected transistors connected in series with the resistance, so that a single transistor operated at the same current density as one of the diode-connected transistors establishes the threshold voltage and detects when the capacitor voltage reaches the threshold.

10 Claims, 6 Drawing Sheets

TIMER CIRCUITS AND METHOD

BACKGROUND OF THE INVENTION

1. Field of the Invention

This invention relates to the field of timing circuits, and particularly to timing circuits and methods for generating time intervals and/or oscillations related to a resistor and capacitor (RC) time constant.

2. Description of the Related Art

Numerous circuits exist to provide timing-related functions such as delay circuits and oscillators. Many such circuits use a resistor/capacitor (RC) network to generate voltages that ramp up or down at a rate determined by the resistance and capacitance values. A ramping voltage is compared to a threshold voltage, and a specified action is taken when the threshold is exceeded.

Figure 1:
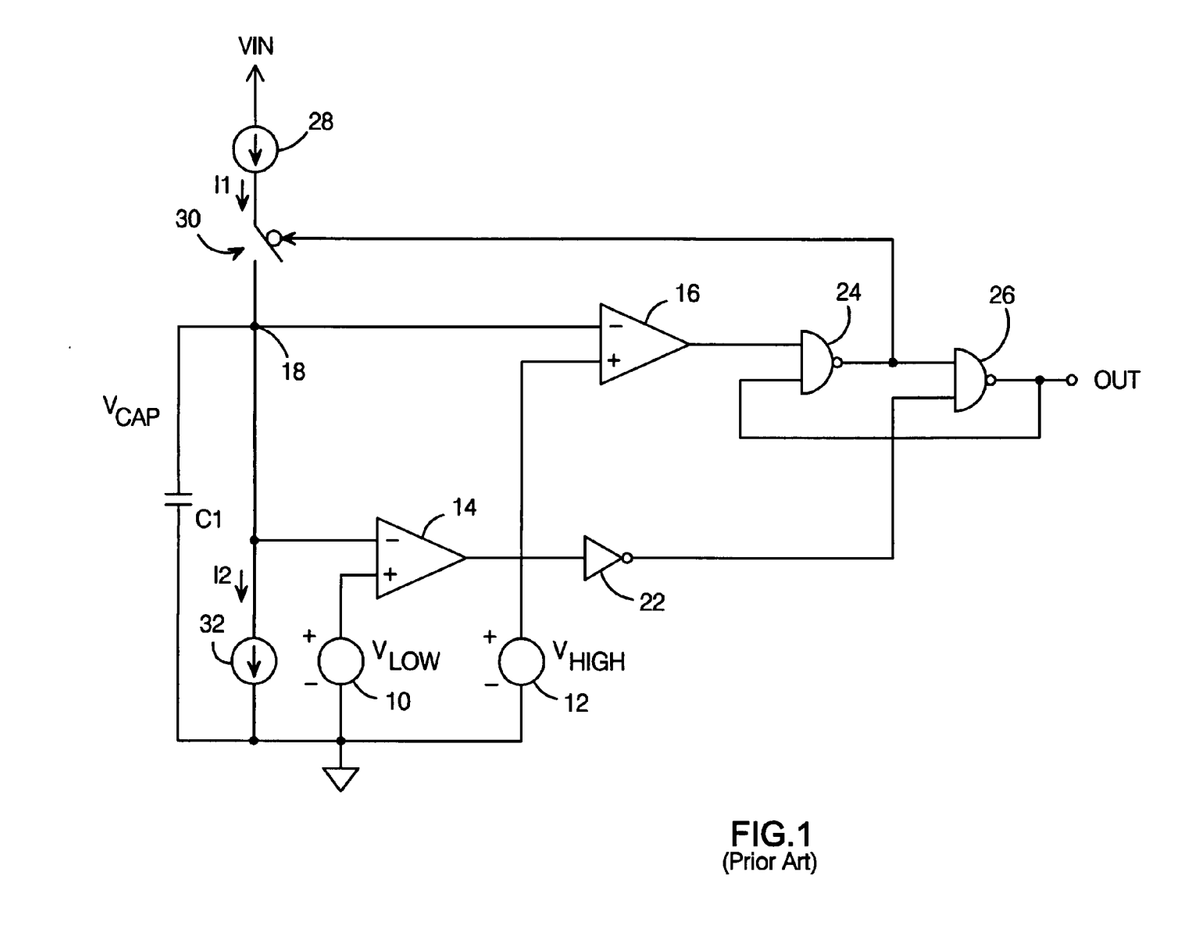
FIG. 1 is a block diagram of a known oscillator circuit.

One possible timing circuit is shown in FIG. 1. Voltage references circuits 10 and 12 provide 'low' ($V_{LOW}$) and 'high' ($V_{LOW}$) reference voltages, respectively, which are provided to respective differential comparators 14 and 16. A capacitor C1 is connected between a node 18 and ground; node 18 is also connected to the other inputs of comparators 14 and 16. The output of comparator 14 drives an inverter 22. Two logic gates 24 and 26 form a flip-flop, which is driven by the outputs of the inverter and comparator 16 and provides the timing circuit's output (OUT). A current source 28 provides a current I1 to node 18 via a switch 30 which is operated by the output of gate 24, and a second current source 32 provides a current I2 to node 18.

In operation, current I2 causes a voltage on C1 to ramp down until it reaches $V_{LOW}$. This condition is detected by comparator 14, which drives the output of inverter 22 low and OUT high. This toggles the flip-flop, causing switch 30 to close such that I1 is applied to C1. I1 is made larger than I2, causing the capacitor voltage $V_{CAP}$ to begin ramping up. When $V_{CAP}$ reaches $V_{HIGH}$, the output of comparator 16 will toggle, as will the flip-flop, making OUT go low and switching off switch 30. The C1 voltage will ramp down again and the cycle will repeat, thereby providing an oscillator function.

However, for predictable operation, the timing circuit shown in FIG. 1 requires the use of differential comparators, as well as the provision of fixed currents and reference voltages which are all set in relationship to each other and ideally remain constant under varying supply voltage and temperature conditions. This can result in a circuit which is unacceptably costly and complex.

SUMMARY OF THE INVENTION

An RC timing circuit and method are presented which address the problems noted above, enabling accurate timing intervals to be generated without the need for precision reference voltages or fixed currents.

The present timing circuit is operated by applying an arbitrary voltage across a resistance such that the resistance has first and second endpoint voltages, and using the resulting current to generate a charging current which charges and/or discharges a capacitance to an endpoint voltage. The timing circuit further includes circuitry arranged such that the capacitance is charged and/or discharged until the voltage across the capacitance crosses a threshold voltage which is proportional to the voltage at one of the resistance's first and second endpoint voltages, such that the capacitance's endpoint voltage tracks one of the resistance's endpoint voltages. Since the capacitance's endpoint voltage tracks one the resistance's endpoint voltages, the voltage across the resistance can vary with supply voltage or temperature, or the resistance value itself can vary, without materially affecting the circuit's timing relationships.

The arbitrary voltage is preferably provided using a pair of diode-connected transistors of opposite polarity connected in series with the resistance, so that a single transistor operated at the same current or current density as one of the diode-connected transistors can be used to establish the threshold voltage and detect when the voltage across the capacitance reaches the threshold. The present invention can be used to implement various types of timing circuits, including oscillators and programmable delay timers.

Further features and advantages of the invention will be apparent to those skilled in the art from the following detailed description, taken together with the accompanying drawings.

DETAILED DESCRIPTION OF THE INVENTION

Figure 2:
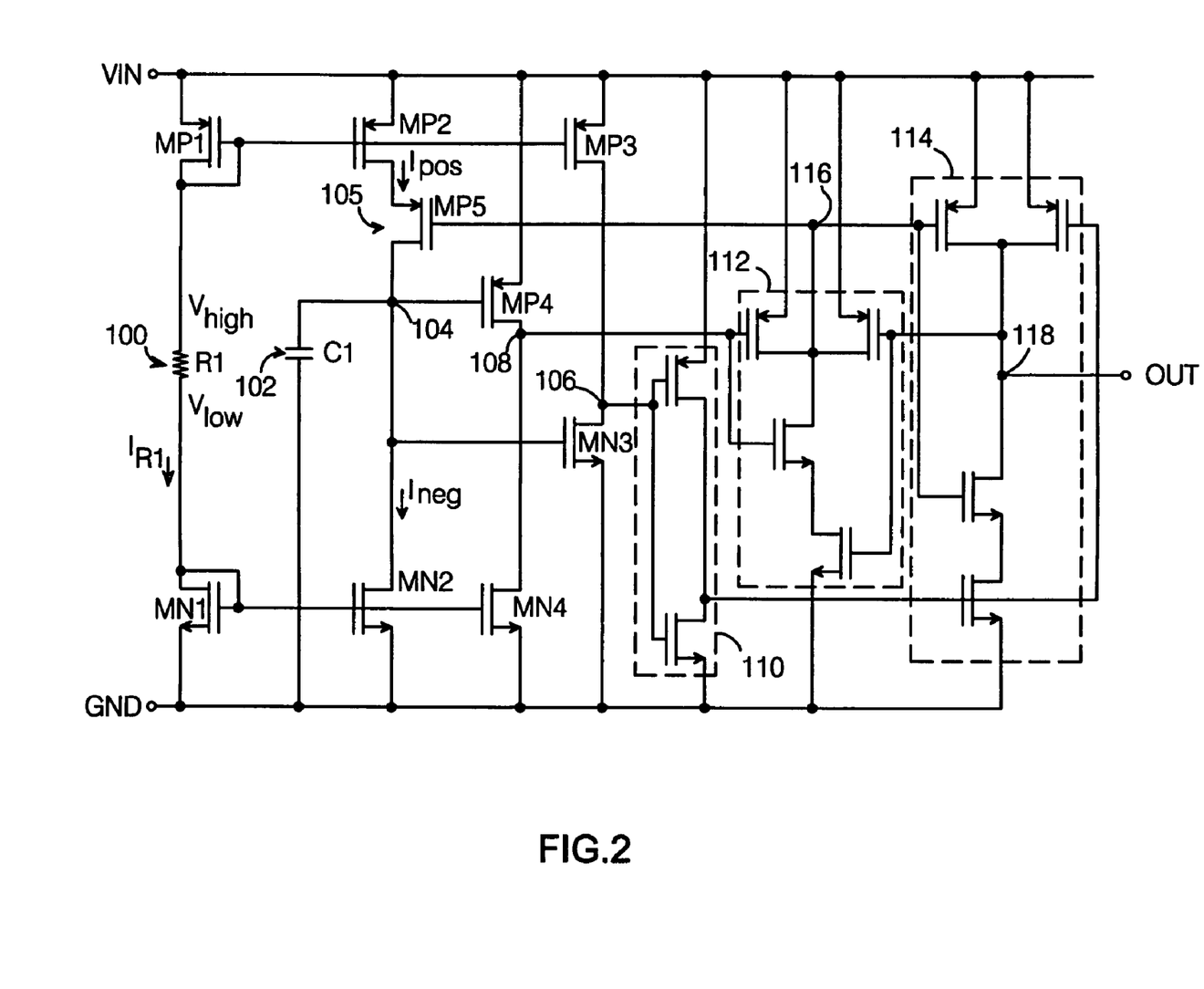
FIG. 2 is a schematic diagram of an oscillator circuit in accordance with the present invention.

The present invention concerns circuits and methods which may be used to provide timing functions. A circuit which illustrates the principles of the present invention is shown in FIG. 2. The circuit has a first supply voltage (VIN) and a second supply voltage (labeled as ground (GND), though other non-zero potentials could be used as well), with the first supply voltage being positive with respect to the second. The invention requires that a voltage be applied across a resistance; this is preferably achieved by connecting a p-type diode-connected transistor (MP1), an n-type diode-connected transistor (MN1), and a resistance 100 having a resistance value R1 in series between VIN and GND. The resulting voltage across R1 has endpoint voltages $V_{high}$ and $V_{low}$, which creates a current $I_{R1}$ that flows in MP1, R1 and MN1.

A capacitance 102 having a capacitance value C1 is connected between a node 104 and one of the supply voltages—typically GND. The circuit includes a means for coupling $I_{R1}$ to the capacitance such that it is charged and/or discharged to an endpoint voltage with a charging current that varies with $I_{R1}$. In FIG. 2, this is accomplished with a first current mirror made from MP1 and a PMOS FET MP2, which provides a positive charging current $I_{pos}$ to C1 (via a switch 105, discussed below), and a second current mirror made from MN1 and an NMOS FET MN2, which provides a negative charging current $I_{neg}$ to C1.

Diode-connected transistors MP1 and MN1 have respective current densities, or current per unit of width. The timing circuit preferably includes circuitry arranged such that C1 is charged and/or discharged until the voltage at node 104 crosses a threshold voltage which is proportional to the voltage at one of R1's first and second endpoint voltages, such that C1's endpoint voltage tracks one of R1's first and second endpoint voltages. This circuitry preferably comprises a transistor having its control input coupled to the C1 voltage at node 104 ("the C1 voltage"), and which is biased at the same current density as one of the p-type and n-type diode-connected transistors. When so arranged, the transistor establishes a threshold voltage equal to one of R1's endpoint voltages, and detects when the C1 voltage crosses the threshold voltage.

For example, in FIG. 2, an NMOS FET MN3 has its gate connected to node 104, and its drain-source circuit connected between a node 106 and GND. A PMOS FET MP3 is connected to form a current mirror with MP1, and provides a bias current to MN3. The timing circuit is arranged such that the current mirrored to node 106 is scaled such that MN3 operates at the same current density as diode-connected transistor MN1. This results in MN3 going into current saturation when its gate voltage—i.e., the C1 voltage—crosses a threshold voltage approximately equal to R1's endpoint voltage $V_{low}$, thereby toggling the voltage at node 106. In this way, MN3 establishes a threshold voltage ($V_{low}$), and detects when the C1 voltage exceeds $V_{low}$—by toggling the voltage at node 106.

Similarly, a PMOS FET MP4 has its gate connected to node 104, and its drain-source circuit connected between a node 108 and VIN. An NMOS FET MN4 is connected to form a current mirror with MN1, and provides a bias current to MP4. The timing circuit is arranged such that the current mirrored to node 108 is scaled such that MP4 operates at the same current density as MP1. This results in the voltage at node 108 being toggled when the C1 voltage crosses a threshold voltage approximately equal to the voltage at R1's endpoint voltage $V_{high}$. Thus, MP4 establishes the threshold voltage ($V_{high}$), and detects when the C1 voltage exceeds $V_{high}$ by toggling the voltage at node 108.

The necessary current scaling can be achieved by properly sizing the transistors. For example, to make the current densities in MN3 and MN1 equal (as noted above), the ratio of the sizes of MP1 to MP3 should be made equal to the ratio of the sizes of MN1 to MN3. Similarly, to make the current densities in MP4 and MP1 equal, the ratio of the sizes of MN1 to MN4 should be made equal to the ratio of the sizes of MP1 to MP4.

The arrangement shown in FIG. 2 is easily made into an oscillator. Node 106 drives an inverter 110, and the output of the inverter and node 108 drive the inputs of a flip-flop, made here from first and second NAND gates (112, 114). Switch 105 is preferably implemented with a PMOS FET MP5, which conducts $I_{pos}$ to node 104 when on. The output (116) of the NAND 112 operates switch 105, and the output (118) of NAND 114 provides the oscillator's output OUT.

When the currents are scaled as described above, the circuit operates in the following manner. When the C1 voltage is substantially positive, MN3 is on and node 106 is low. MN2 current $I_{neg}$ will charge C1 towards zero. As the C1 voltage reaches $V_{low}$, MN3 is turned off and node 106 goes high, driving the output of inverter 110 low, output OUT high, and the output (116) of NAND 112 low, thereby turning on switch MP5. By scaling MP2 current $I_{pos}$ larger than MN2 current $I_{neg}$, the C1 voltage is made to rise. When the C1 voltage exceeds $V_{low}$, MN3 will be turned on and node 106 will fall, but the flip-flop will have captured its high state and the C1 voltage will continue to ramp up. When the C1 voltage reaches $V_{high}$, MP4 is turned off and node 108 falls, reversing the state of the flip-flop and restoring the circuit to the starting conditions postulated above, with the C1 voltage falling.

In this way, the C1 voltage at node 104 ramps between $V_{low}$ and $V_{high}$ such that C1's endpoint voltages track R1's first and second endpoint voltages, and output OUT oscillates with a period each portion of which is determined by the time required for the voltage at node 104 to ramp between $V_{low}$ and $V_{high}$.

Since the rate at which node 104 ramps between the thresholds is proportional to $I_{pos}$ and $I_{neg}$, the two semi-periods will be inversely proportional to $I_{pos}$ and $I_{neg}$. Since $I_{pos}$ and $I_{neg}$ are derived in proportion to resistor current $I_{R1}$, they will also be proportional to the difference in thresholds ($V_{high}-V_{low}$), which is the voltage across R1. Since the semi-periods are each proportional to the voltage across R1 as well as inversely proportional to it, they are first order insensitive to the actual voltage across R1. This means that the period of oscillation has no first order dependence on the supply voltage or upon the gate voltages of MP1 and MN1, and thus the voltage across R1 can vary with supply voltage or temperature, or the resistance value itself can vary, without materially affecting the circuit's timing relationships, though as shown below, the R1 value does directly affect the period and semi-period durations.

As an example, assume that the transistors are sized such that the current in MN2 ($i_{neg}$) is nominally 1/20 of $I_{R1}$, while the MP2 current ($i_{pos}$) is nominally equal to $I_{R1}$. Then, the time t1 required for the C1 voltage to ramp down is given by:

$$t1=C1*(V_{high}-V_{low})/i_{neg},$$

and since $i_{neg}=((V_{high}-V_{low})/R1))/20$, $$t1=C1*(V_{high}-V_{low})/[((V_{high}-V_{low})/R1))/20]$$
$$=C1*R1*20.$$

Similarly, the ramp up time t2 is given by:

$$t2=C1*(V_{high}-V_{low})/(i_{pos}-i_{neg})=C1*R1*(19/20).$$

The period of oscillation T=t1+t2=C1*R1*(419/20).

As an alternative to scaling MP2 current $I_{pos}$ larger than MN2 current $I_{neg}$, another switch (not shown) could be interposed between MN2 and node 104, and arranged to block $I_{neg}$ from node 104 when switch 105 is closed.

Note that there are numerous means by which a circuit in accordance with the present invention could be implemented; the circuit shown in FIG. 2 is merely exemplary. It is only essential that a voltage be applied across a resistance to create a first current which is coupled to a capacitance such that the capacitance is charged and/or discharged to a resistor endpoint voltage by a charging current which varies with the first current, such that the capacitance's endpoint voltage tracks one of the resistor's endpoint voltages.

Figure 3:
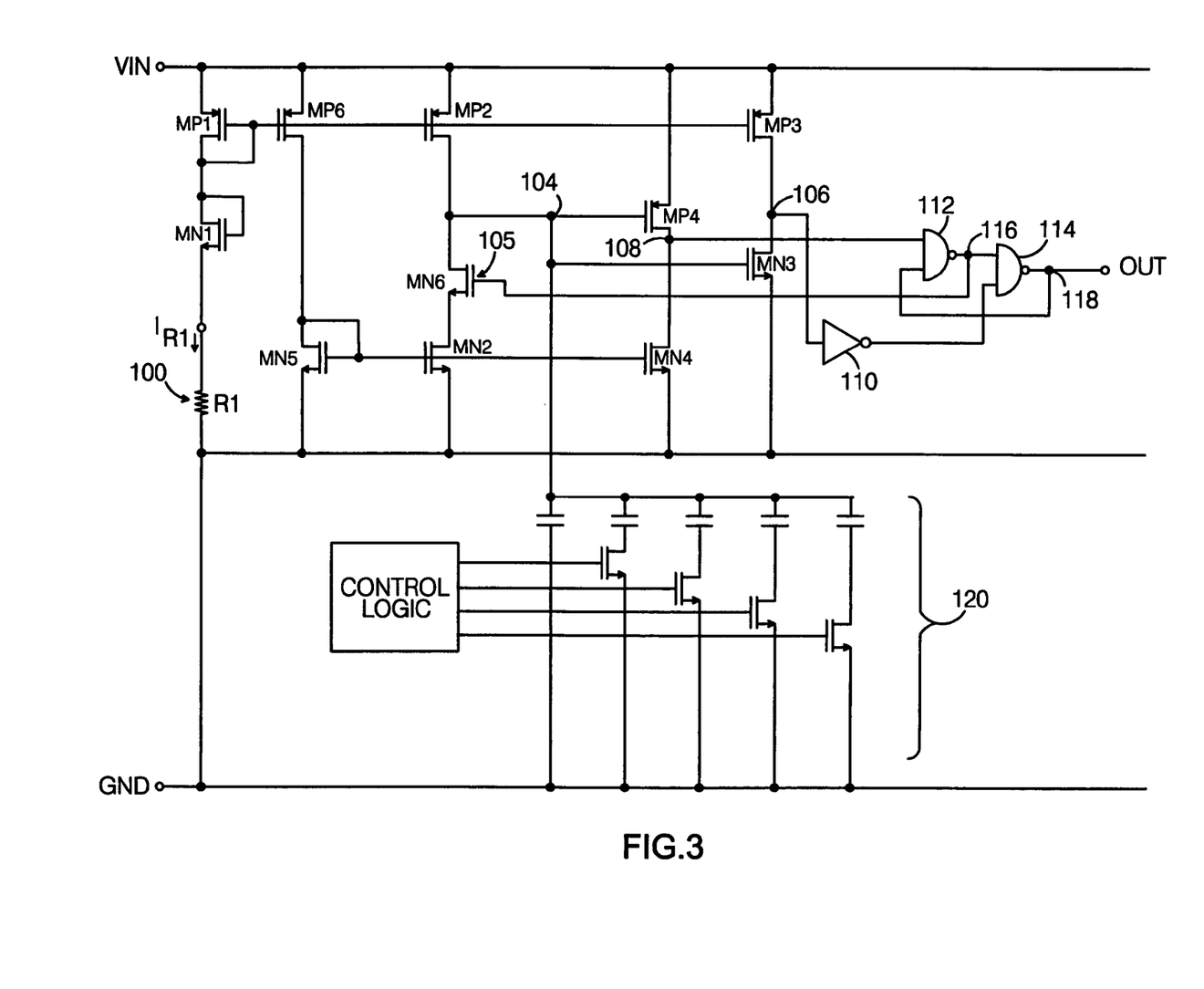
FIG. 3 is a schematic diagram of another possible oscillator circuit embodiment in accordance with the present invention.

Another possible implementation of an oscillator which employs the principles of the present invention is shown in FIG. 3. The circuit arrangement is similar to that shown in FIG. 2, except for the arrangement of the timing resistor and diode-connected transistors. The oscillator would typically be implemented as an integrated circuit (IC). Here, the NMOS diode-connected transistor MN1 is moved above resistor 100, thereby enabling R1 to be accessible external to the IC. For this configuration, MN1 should be an isolated device, so that different source potentials can be accommodated.

Since MP1 and MN1 are still connected in series with R1, resistor current $I_{R1}$ will be the same as it was in FIG. 2 (assuming equal supply voltages). An extra circuit branch comprises a PMOS FET MP6 connected to form a current mirror with MP1, and a diode-connected NMOS FET MN5. The rest of the oscillator is as before, except that MN2 and MN4 form current mirrors with MN5 instead of MN1.

As with FIG. 2, the oscillator of FIG. 3 is arranged such that the current mirrored to node 106 is scaled such that MN3 operates at the same current density as MN1, and such that the current mirrored to node 108 is scaled such that MP4 operates at the same current density as MP1. This results in the voltage at node 106 being toggled when the voltage at node 104 crosses a first threshold voltage approximately equal to the voltage across said MN1 (gate-to-source), and such that the voltage at node 108 is toggled when the voltage at node 104 crosses a second threshold voltage approximately equal to the voltage at the gate of MP1. In this arrangement, because R1 is offset to GND, the two threshold voltages with respect to VIN and GND are not the actual resistor endpoint voltages. However, since the difference between the thresholds is made to be the same as the voltage across R1, the circuit's timing still works as it did in FIG. 2.

As before, capacitance C1 is connected between node 104 and GND. In this embodiment, the capacitance is implemented with an optional switchable capacitance network 120, in which a desired combination of capacitors is connected to node 104 to provide frequency trim; a single capacitance could also be used. Note also that switch 105 is here an NMOS FET MN6, located between node 104 and MN2. This arrangement is required when the down slope (MN2) current is scaled to be larger than the up slope (MP2) current; the larger current must be the one switched, in order to overwhelm the smaller current.

Figure 4:
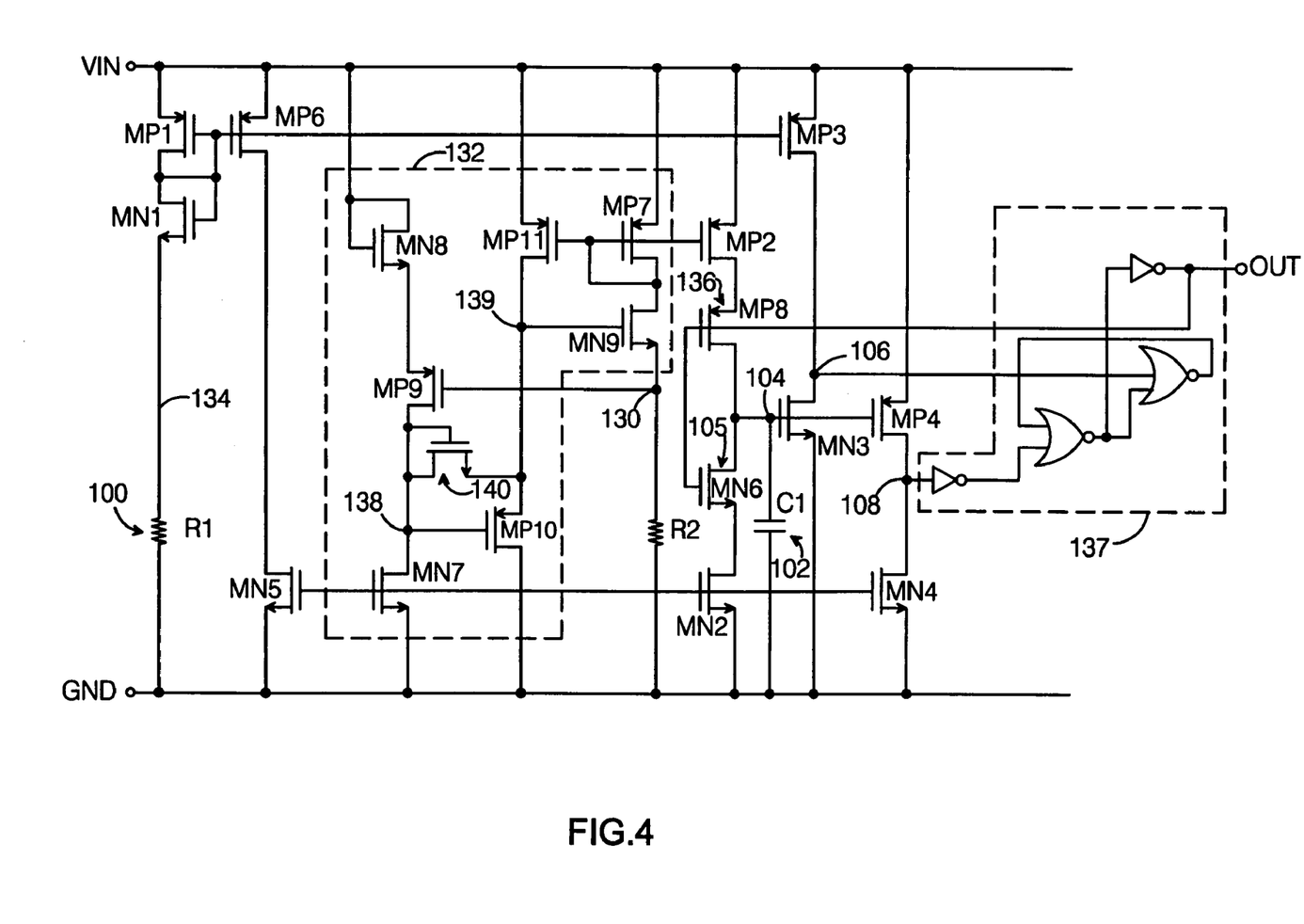
FIG. 4 is a schematic diagram of another possible oscillator circuit embodiment in accordance with the present invention.

The oscillators shown in FIGS. 2 and 3 combine precision, supply voltage independence, and invariant duty ratio with simplicity. The duty ratio can be set by design and faithfully reproduced in manufacture as the ratio of MOS width ratios. However, some applications may require a user-programmable duty ratio. One possible implementation of such an oscillator is shown in FIG. 4. The oscillator shown enables a user to set both the duty ratio and frequency with programming components—i.e., R1, R2 and C1 in FIG. 4—which may be variously on or off chip.

The operation of the circuit is similar to that of FIG. 3, with diode-connected FETs MP1 and MN1 and ground-referenced resistor R1 configured as before, FETs MP6 and MN5 energizing a negative rail current mirror, and C1 connected between node 104 and GND. MP3 and MN3 form a first threshold detection circuit with output at node 106, and MP4 and MN4 form a second threshold detection circuit with output at node 108. The circuit is arranged such that the current mirrored to node 106 is scaled such that MN3 operates at the same current density as MN1, and such that the current mirrored to node 108 is scaled such that MP4 operates at the same current density MP1, thereby causing the voltage at node 106 to toggle when the voltage at node 104 crosses a first threshold voltage approximately equal to the voltage across MN1, and the voltage at node 108 to toggle when the voltage at node 104 crosses a second threshold voltage approximately equal to the voltage at the gate of MP1.

A charging current provided to C1 via MN2 and switch 105 (MN6) in a fixed proportion to $I_{R1}$ is also as before. However, instead of deriving the second (positive) charging current from $I_{R1}$, a separately adjustable second ground-referenced resistor (R2) is used, connected between a node 130 and GND. The oscillator includes circuitry 132 arranged to maintain a voltage at node 130 equal to the voltage at the R1 terminal connected to MN1 (a node 134), thereby creating a second current ($I_{R2}$) such that the ratio of $I_{R2}$ to $I_{R1}$ is equal to the ratio of R1 to R2. A diode-connected PMOS FET MP7 is connected to form a current mirror with MP2 which mirrors $I_{R2}$ to node 104 via a second switch 136, here made from a PMOS FET MP8. When so arranged, capacitance C1 is discharged and the voltage at node 104 ramps down at a rate which is inversely proportional to R1×C1 when switch 105 is closed and switch 136 is open, and C1 is charged and the voltage at node 104 ramps up at a rate which is inversely proportional to R2×C1 when switch 136 is closed and switch 105 is open.

As noted above, the ratio between $I_{R2}$ and $I_{R1}$ is the same as the ratio of R1 to R2. To achieve this, it is important that both ground-referenced resistors be driven by the same voltage. In FIG. 4, this voltage is positive, but note that the circuit could as well be made to operate from a negative supply with a suitable process and substrate referencing.

A flip-flop 137 functionally similar to that used in FIGS. 2 and 3 receives the voltages at nodes 106 and 108 and provides the oscillator's output OUT, and provides the control signal needed to operate switches 136 and 105. When the common gates of switch FETs MN6 and MP8 are driven negative by the signal at OUT, the MP2 current is delivered to C1 via switch 136, which has the effect of charging C1 with a positive slope set by R2 and the voltage across R1, which has been made to appear across R2. When OUT is high, the MN2 current is delivered to C1 via switch 105 to charge C1 with a negative slope.

Since the threshold transistors (MP4, MN3) are biased in proportion to their size relative to the mirror transistors, the difference between the upper and lower thresholds will be proportional to the supply voltage less the combined voltage drop of MN1 and MP1. Since this is the voltage seen by both R1 and R2, the ramp down time should be given by R1*C1, and the ramp up time should be given by R2*C1. Together, these set both the duty ratio and the period of oscillation for the circuit.

Circuitry 132 could be implemented in a number of different ways. In the exemplary implementation shown in FIG. 4, a FET MN7 is connected to form a current mirror with MN5, which mirrors the $I_{R1}$ current mirrored by MP6 to a node 138. A structure comprising a diode-connected NMOS FET MN8 and a PMOS FET MP9 are connected between VIN and node 138. MN8 and MP9 are in the same proportion to MN1 and MP1 as is MP6 to MP1. As a result, the sum of the gate voltages of MN8 and MP9, as they operate at the current set by MP6 and mirrored by MN5 and MN7, should be the same as that of MN1 and MP1, despite their being in opposite order in the current path. When so arranged, the gate of MP9, which is connected to node 130 connected to R2, can be used to easily control the MN8/MP9 current and servo it to that of MN7.

R2 can pull the gate of MP9 low, insuring current from MN7 is conveyed to MN8 by MP9. In response to the voltage at the drain of MP9, a PMOS FET MP10 having its gate connected to node 138 and its source-drain circuit connected between a node 139 and GND drives a FET MN9 connected between MP7 and node 130, which in turn pulls up on the gate of MP9. The gate voltage will rise with the voltage at the drain of MP9 until the current in MN8 and MP9 begins to decrease. At this point the circuit will be in equilibrium, operating with just enough gate voltage to cause the MN7 current to flow in MP9 and MN8.

The current per unit of width in MP9 and MN8 should just match the current per unit width of MP1 and MN1, so the voltage required to maintain the equilibrium should just equal the source voltage of MN1.

MN9 drives node 130, and supplies all the R2 current. A FET MP11 is connected to form a current mirror with MP7, which mirrors the R2 current to node 139 to provide the drive for MP10. As noted above, FET MP2 mirrors this same current to node 104 via switch 136. A starting diode 140 is preferably connected between nodes 138 and 139.

Figure 5:
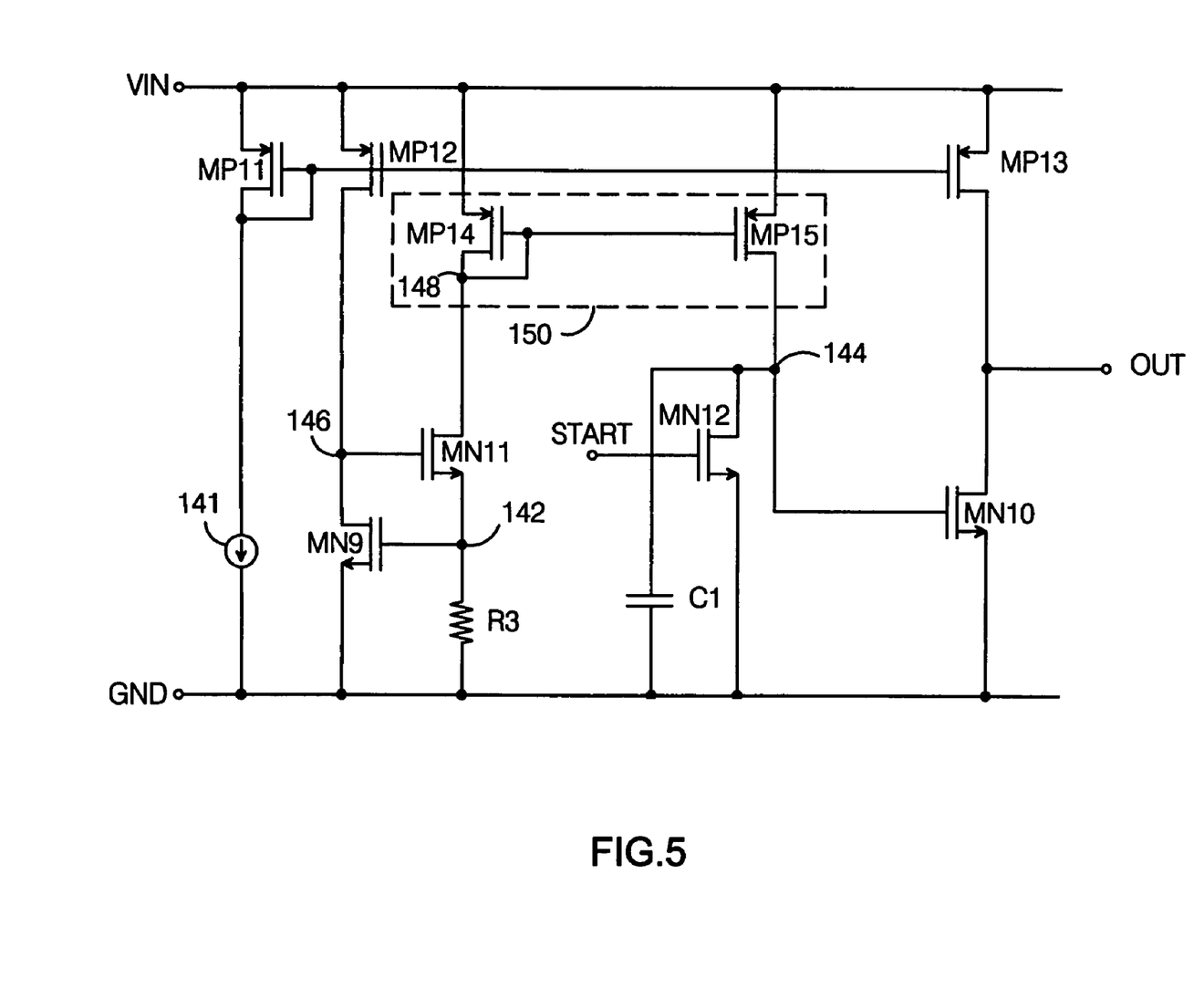
FIG. 5 is a schematic diagram of a programmable delay timer in accordance with the present invention.

Another application for which the present timing circuit is well-suited is that of a programmable delay timer. One possible implementation of such a timer is shown in FIG. 5. A current source 141 provides a current to a current mirror comprising diode-connected FET MP11 and PMOS FETs MP12 and MP13, which provide equal currents to matched devices MN9 and MN10; the gate of MN9 is connected to a node 142 and the gate of MN10 is connected to a node 144. A FET MN11 has its gate connected to the junction (146) of MP12 and MN9, and its drain-source circuit connected between a node 148 and node 142; a timing resistor having a resistance R3 is connected between node 142 and GND. A current mirror 150 is connected to mirror the MN11 current to node 144.

In operation, MP12 drives the gate of MN11 to turn on MN9, causing MN9 to accept the MP12 current, thereby causing the current delivered to current mirror 150 to be that necessary to raise the voltage across R3 to the gate voltage of MN9; mirror 150 comprises diode-connected FET MP14 and MP15. This current is mirrored to node 144 and capacitance C1, which is connected between node 144 and GND. Assuming that the voltage at node 144 is initially low, the MP15 current begins to charge C1 and the voltage at node 144 will rise.

While the C1 voltage applied to the gate of MN10 is still low, current from MP13 holds OUT high. However, as MN10's gate voltage rises and approaches the voltage at node 142, reflecting a similar current in the matched device MN9, the MN10 current will rise to exceed that of MP13 and OUT will be pulled low. Thus, proper operation is achieved when the delay timer is arranged such that the current mirrored to the OUT node is scaled such that MN10 operates at the same current density as MN4, such that OUT toggles when the voltage at node 144 ($V_{C1}$) is equal to the voltage at node 142.

The delay timer preferably includes a switch which is used to initiate the delay; this is provided with a FET MN12 in FIG. 5 connected to pull node 144 towards GND in response to a control signal START. When START is high, MN12 is on, node 144 is pull low, and OUT is high. When START is toggled from high to low, the MP15 current will charge C1 with a current $i_{MP15}$ given by:

$$i_{MP15} = A \ast V_{R3}/R3,$$ where A is the gain of current mirror 150 and $V_{R3}$ is the voltage at node 142. When $V_{C1}$ reaches $V_{R3}$, OUT is toggled low. The time T required for $V_{C1}$ to reach $V_{R3}$ is given by:

$$T = C1 \ast V_{R3}/i_{MP15} = C1 \ast V_{R3}/(A \ast V_{R3}/R3) = C1 \ast R3/A$$

This result depends upon the values of R3, C1 and A. It is independent of the actual $V_{gs}$ of MN9 or the current provided by current source 141. Note that both R3 and C1 are ground-referenced, and thus could be externally accessible.

Figure 6:
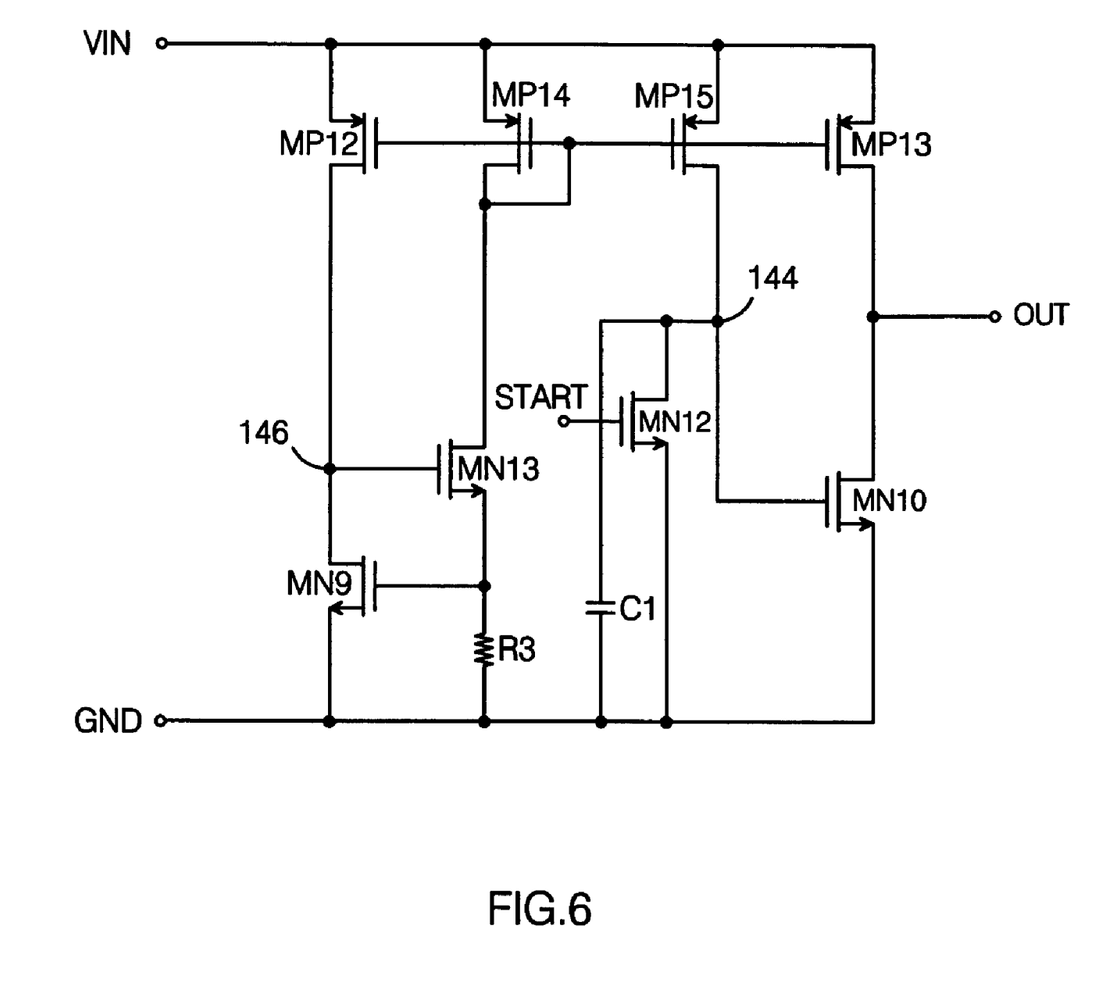
FIG. 6 is a schematic diagram of another possible programmable delay timer embodiment in accordance with the present invention.

A self-biased variation of the FIG. 5 circuit is shown in FIG. 6. Here, a FET MN13 (MN11 in FIG. 5) is either a depletion device which is on at zero bias, or is shunted by a small conductance; this is necessary to ensure that the circuit starts. In this circuit, the R3 current is not only used to charge C1, but is mirrored to MN9 and MN10 to set their gate-source voltages equal and make the threshold voltage so that as the C1 voltage goes from zero to the threshold, the change in voltage equals the whole voltage across R3. Though differently arranged than the FIG. 5 circuit, this variation still employs a single transistor (MN10) to both set and detect the threshold voltage, as do all the circuits described herein.

While particular embodiments of the invention have been shown and described, numerous variations and alternate embodiments will occur to those skilled in the art. Accordingly, it is intended that the invention be limited only in terms of the appended claims.

We claim:
1. A timing circuit, comprising:
a capacitance;
a first resistance (R1);
an arbitrary voltage applied across R1 such that R1 has first and second endpoint voltages, thereby creating a first current;
a first means for coupling said first current to said capacitance such that said capacitance is charged to a first endpoint voltage by a positive charging current which varies with said first current, and a second means for coupling said first current to said capacitance such that said capacitance is discharged to a second endpoint voltage by a negative charging current which varies with said first current, said first and second coupling means arranged such that the magnitudes of said positive and negative charging currents can be established independently;
circuitry arranged such that said capacitance is charged until the voltage across said capacitance crosses a first threshold voltage which is proportional to one of R1's first and second endpoint voltages, and is discharged until the voltage across said capacitance crosses a second threshold voltage which is proportional to the other of R1's first and second endpoint voltages, such that said capacitance's endpoint voltages track R1's first and second endpoint voltages, said first and second coupling means enabling the time required to charge said capacitance to be different from the time required to discharge said capacitance.
2. The timing circuit of claim 1, further comprising:
first and second supply voltages, with said first supply voltage being positive with respect to said second supply voltage;
a p-type diode-connected transistor;
an n-type diode-connected transistor, said p-type and n-type diode-connected transistors connected in series with R1 and between said first and second supply voltages to establish said voltage across R1, said p-type and n-type diode-connected transistors having respective current densities;
said circuitry comprising third and fourth transistors having their control inputs coupled to said capacitor voltage;
a third means for coupling said first current to said third transistor such that said third transistor is biased at the same current density as said p-type diode-connected transistor such that said third transistor establishes one of said first and second threshold voltages and detects when the voltage across said capacitance crosses said threshold voltage; and
a fourth means for coupling said first current to said fourth transistor such that said fourth transistor is biased at the same current density as said n-type diode-connected transistor such that said fourth transistor establishes the other of said first and second threshold voltages and detects when the voltage across said capacitance crosses said threshold voltage.

3. The timing circuit of claim 1, wherein said first and second means for coupling said first current to said capacitance comprises respective current mirrors connected to mirror said first current to said capacitance.

4. A timing circuit, comprising:
a capacitance C1;
a first resistance (R1);
an arbitrary voltage applied across R1 such that R1 has first and second endpoint voltages, thereby creating a first current;
a means for coupling said first current to said capacitance such that said capacitance is charged and/or discharged to an endpoint voltage by a charging current which varies with said first current;
circuitry arranged such that said capacitance is charged and/or discharged until the voltage across said capacitance crosses a threshold voltage which is proportional to one of R1's first and second endpoint voltages, such that said capacitance's endpoint voltage tracks one of R1's first and second endpoint voltages;
first and second supply voltages, with said first supply voltage being positive with respect to said second supply voltage;
a p-type diode-connected transistor; and
an n-type diode-connected transistor, said p-type and n-type diode-connected transistors connected in series with R1 and between said first and second supply voltages to establish said voltage across R1;
wherein R1 has first and second terminals, said p-type diode-connected transistor connected between said first supply voltage and R1's first terminal, and said n-type diode-connected transistor connected between R1's second terminal and said second supply voltage, and wherein said capacitance is connected between a first node and a supply voltage and said charging current is provided at said first node, said circuitry comprising at least one threshold detection circuit comprising:
a third transistor connected to form a current mirror with said p-type diode-connected transistor which mirrors said first current to a second node; and
a fourth transistor having its control input connected to said first node and its current circuit connected between said second node and said second supply voltage, said timing circuit arranged such that the current mirrored to said second node is scaled such that said fourth transistor operates at the same current density as said n-type diode-connected transistor such that the voltage at said second node is toggled when the voltage at said first node crosses a threshold voltage approximately equal to the voltage at said second resistance terminal, the voltage at said second node being said threshold detection circuit's output signal.

5. A timing circuit, comprising:
a capacitance C1;
a first resistance (R1);
an arbitrary voltage applied across R1 such that R1 has first and second endpoint voltages, thereby creating a first current;
a means for coupling said first current to said capacitance such that said capacitance is charged and/or discharged to an endpoint voltage by a charging current which varies with said first current;
circuitry arranged such that said capacitance is charged and/or discharged until the voltage across said capacitance crosses a threshold voltage which is proportional to one of R1's first and second endpoint voltages, such that said capacitance's endpoint voltage tracks one of R1's first and second endpoint voltages;
first and second supply voltages, with said first supply voltage being positive with respect to said second supply voltage;
a p-type diode-connected transistor; and
an n-type diode-connected transistor, said p-type and n-type diode-connected transistors connected in series with R1 and between said first and second supply voltages to establish said voltage across R1;
wherein R1 has first and second terminals, said p-type diode-connected transistor connected between said first supply voltage and R1's first terminal, and said n-type diode-connected transistor connected between R1's second terminal and said second supply voltage, and wherein said capacitance is connected between a first node and a supply voltage and said charging current is provided at said first node, said circuitry comprising at least one threshold detection circuit comprising:
a third transistor connected to form a current mirror with said n-type diode-connected transistor which mirrors said first current to a second node; and
a fourth transistor having its control input connected to said first node and its current circuit connected between said second node and said first supply voltage, said timing circuit arranged such that the current mirrored to said second node is scaled such that said fourth transistor operates at the same current density as said p-type diode-connected transistor such that the voltage at said second node is toggled when the voltage at said first node crosses a threshold voltage approximately equal to the voltage at R1's first terminal, the voltage at said second node being said threshold detection circuit's output signal.

6. A timing circuit, comprising:
a capacitance C1;
a first resistance (R1);
an arbitrary voltage applied across R1 such that R1 has first and second endpoint voltages, thereby creating a first current;
a means for coupling said first current to said capacitance such that said capacitance is charged and/or discharged to an endpoint voltage by a charging current which varies with said first current;
circuitry arranged such that said capacitance is charged and/or discharged until the voltage across said capacitance crosses a threshold voltage which is proportional to one of R1's first and second endpoint voltages, such that said capacitance's endpoint voltage tracks one of R1's first and second endpoint voltages;
first and second supply voltages, with said first supply voltage being positive with respect to said second supply voltage;
a p-type diode-connected transistor; and
an n-type diode-connected transistor, said p-type and n-type diode-connected transistors connected in series with R1 and between said first and second supply voltages to establish said voltage across R1;
wherein R1 has first and second terminals, said p-type diode-connected transistor connected between said first supply voltage and R1's first terminal, and said n-type diode-connected transistor connected between R1's second terminal and said second supply voltage, and wherein said capacitance is connected between a first node and a supply voltage and said charging current is provided at said first node, said circuitry comprising first and second threshold detection circuits, said first threshold detection circuit comprising:
a third transistor connected to form a current mirror with said p-type diode-connected transistor which mirrors said first current to a second node; and a fourth transistor having its control input connected to said first node and its current circuit connected between said second node and said second supply voltage;

said second threshold detection circuit comprising:
a fifth transistor connected to form a current mirror with said n-type diode-connected transistor which mirrors said first current to a third node; and
a sixth transistor having its control input connected to said first node and its current circuit connected between said third node and said first supply voltage;

said timing circuit arranged such that the current mirrored to said second node is scaled such that said fourth transistor operates at the same current density as said n-type diode-connected transistor, and such that the current mirrored to said third node is scaled such that said sixth transistor operates at the same current density as said p-type diode-connected transistor, such that the voltage at said second node is toggled when the voltage at said first node crosses a threshold voltage approximately equal to the voltage at R1's second terminal, the voltage at said second node being said first threshold detection circuit's output signal, and such that the voltage at said third node is toggled when the voltage at said first node crosses a threshold voltage approximately equal to the voltage at R1's first terminal, the voltage at said third node being said second threshold detection circuit's output signal.

7. An oscillator, comprising:
first and second supply voltages with said first supply voltage being positive with respect to said second supply voltage;
a capacitance connected between a first node and one of said supply voltages;
a first resistance having first and second terminals;
a p-type diode-connected transistor connected between said first supply voltage and R1's first terminal;
an n-type diode-connected transistor connected between R1's second terminal and said second supply voltage, the resulting voltage applied across R1 such that R1 has first and second endpoint voltages, thereby creating a first current;
a first threshold detection circuit comprising:
a third transistor connected to form a current mirror with said p-type diode-connected transistor which mirrors said first current to a second node; and
a fourth transistor having its control input connected to said first node and its current circuit connected between said second node and said second supply voltage;
a second threshold detection circuit comprising:
a fifth transistor connected to form a current mirror with said n-type diode-connected transistor which mirrors said first current to a third node; and
a sixth transistor having its control input connected to said first node and its current circuit connected between said third node and said first supply voltage;
said oscillator arranged such that the current mirrored to said second node is scaled such that said fourth transistor operates at the same current density as said n-type diode-connected transistor, and such that the current mirrored to said third node is scaled such that said sixth transistor operates at the same current density as said p-type diode-connected transistor, such that the voltage at said second node is toggled when the voltage at said first node crosses a threshold voltage approximately equal to the voltage at R1's second terminal, the voltage at said second node being said first threshold detection circuit's output signal, and such that the voltage at said third node is toggled when the voltage at said first node crosses a threshold voltage approximately equal to the voltage at R1's first terminal, the voltage at said third node being said second threshold detection circuit's output signal;
a seventh transistor connected to form a current mirror with said p-type diode-connected transistor which mirrors said first current to provide a positive charging current to said first node;
an eighth transistor connected to form a current mirror with said n-type diode-connected transistor which mirrors said first current to provide a negative charging current to said first node;
a ninth transistor connected between one of said seventh and eighth transistors and said first node and arranged to conduct one of said positive and negative charging currents to said first node in response to a control signal applied to its control input; and
a flip-flop which receives voltages that vary with the voltages at said second and third nodes and provides said oscillator's output, said control signal derived from said output such that the voltage at said first node ramps between said first and second threshold voltages,
such that said capacitance's endpoint voltages track R1's first and second endpoint voltages and said output oscillates with a period each portion of which is determined by the time required for the voltage at said first node to ramp between said first and second threshold voltages.

8. The oscillator of claim 7, wherein said seventh transistor is p-type and said eighth transistor is n-type and said ninth transistor is connected between said seventh transistor and said first node, said seventh and eighth transistors sized such that the current conducted by said seventh transistor is greater than the current conducted by said eighth transistor, such that the voltage at said first node increases when said ninth transistor conducts said positive charging current to said first node in response to said control signal.

9. The oscillator of claim 7, wherein said seventh transistor is p-type and said eighth transistor is n-type and said ninth transistor is connected between said seventh transistor and said first node, further comprising a tenth transistor connected between said eighth transistor and said first node which is arranged to block said negative charging current from said first node when said ninth transistor conducts said positive charging current to said first node in response to said control signal.

10. A method of creating a timing interval, comprising:
providing a capacitance;
providing a first resistance;
applying a voltage across said first resistance to create a first current;
coupling said first current to said capacitance such that said capacitance is charged by a charging current which is proportional to said first current;
coupling said first current to said capacitance such that said capacitance is discharged by a discharging current which is proportional to said first current,
said coupling arranged such that said charging and discharging currents can be established independently, thereby enabling the time required to charge said capacitance to be different from the time required to discharge said capacitance;
detecting when the voltage across said capacitance crosses a threshold voltage which is proportional to the voltage across said first resistance; and
toggling an output signal when said threshold voltage is crossed.

* * * * *